(12) United States Patent
Drakshapalli et al.

(10) Patent No.: US 7,489,263 B1
(45) Date of Patent: *Feb. 10, 2009

(54) DISCRETE-TIME PROGRAMMABLE-GAIN ANALOG-TO-DIGITAL CONVERTER (ADC) INPUT CIRCUIT WITH MULTI-PHASE REFERENCE APPLICATION

(75) Inventors: Prashanth Drakshapalli, Austin, TX (US); John Paulos, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/864,890

(22) Filed: Sep. 28, 2007

(51) Int. Cl.
H03M 1/12 (2006.01)
(52) U.S. Cl. .................. 341/155; 341/122; 341/108
(58) Field of Classification Search ............ 341/108, 341/143, 155, 122
See application file for complete search history.

(56) References Cited

U.S. PATENT DOCUMENTS

| | | | |
|---|---|---|---|
| 3,449,741 A * | 6/1969 | Egerton, Jr. ............. 341/108 |
| 3,462,759 A * | 8/1969 | Hoffman ................ 341/172 |
| 4,524,346 A | 6/1985 | Bosserhoff et al. |
| 4,764,753 A | 8/1988 | Yukawa |
| 4,831,381 A | 5/1989 | Hester |
| 5,574,457 A | 11/1996 | Garrity et al. |
| 5,659,314 A | 8/1997 | Tokura et al. |
| 6,011,433 A | 1/2000 | Nairn |
| 6,037,887 A | 3/2000 | Wu et al. |
| 6,486,711 B1 | 11/2002 | Tsay et al. |
| 6,559,789 B1 | 5/2003 | Somayajula |
| 6,621,441 B2 | 9/2003 | Haroun et al. |
| 6,624,779 B2 | 9/2003 | Hochschild |
| 7,057,540 B2 * | 6/2006 | Muhammad et al. ....... 341/143 |
| 7,091,896 B2 | 8/2006 | Oprescu |
| 7,136,006 B2 | 11/2006 | Koh et al. |
| 7,209,060 B2 | 4/2007 | Kumar et al. |
| 7,253,675 B2 | 8/2007 | Aksin et al. |
| 7,307,572 B2 | 12/2007 | Garrity et al. |
| 7,375,664 B2 * | 5/2008 | Bilhan ................... 341/122 |
| 7,397,403 B2 | 7/2008 | Oprescu |
| 2003/0128143 A1 * | 7/2003 | Yap et al. ............... 341/143 |

(Continued)

OTHER PUBLICATIONS

U.S. Appl. No. 11/864,884, filed Sep. 28, 2007, Drakshapalli.

Primary Examiner—Jean B Jeanglaude
(74) Attorney, Agent, or Firm—Andrew M. Harris; Mitch Harris, Atty at Law, LLC

(57) ABSTRACT

A discrete-time programmable-gain analog-to-digital converter (ADC) input circuit with multi-phase reference application, provides a high input impedance level substantially independent of input capacitor size and input signal gain setting. An input voltage is sampled at the common mode voltage of the input, using one or more reference capacitor(s) that has been charged in a previous clock phase to the reference feedback voltage. The sampled input voltage is then applied in series with a quantizer-controlled reference voltage to the input of an integrator in a second clock phase. The summing mode of the integrator is maintained at the reference common-mode voltage. Since the charge pulled from the input voltage source is substantially determined only by the quantization error and input noise voltage, the circuit has a high signal input impedance. Since the input voltage source is sampled with respect to its common-mode voltage, the common-mode input impedance is also high.

25 Claims, 4 Drawing Sheets

U.S. PATENT DOCUMENTS

2006/0082480 A1    4/2006  Oprescu
2006/0082481 A1    4/2006  Oprescu
2006/0082486 A1    4/2006  Oprescu
2007/0285296 A1*  12/2007  Bilhan ........................ 341/155

* cited by examiner

DISCRETE-TIME PROGRAMMABLE-GAIN ANALOG-TO-DIGITAL CONVERTER (ADC) INPUT CIRCUIT WITH MULTI-PHASE REFERENCE APPLICATION

BACKGROUND OF THE INVENTION

1. Field of the Invention

The present invention relates generally to discrete-time input circuits, and more specifically, to a discrete-time analog-to-digital converter (ADC) input circuit having input signal and common-mode current nulling.

2. Background of the Invention

Measurement input circuits for ADCs must typically handle large common mode voltage differences between the input signal and the feedback reference voltage, especially in applications such as AC line power or DC measurement circuits and in test equipment such as digital voltmeters (DVMs). Even with the use of transformers or resistive dividers, the dynamic range needed for universal applicability typically requires one or more programmable gain stages to preserve signal to noise ratio (SNR) and a high input impedance buffer stage at the input to avoid loading the measured source, in particular where the source may have a large input voltage range requiring several gain settings in the first stage of the ADC analog section.

Discrete-time sampling circuits, such as those utilized in switched-capacitor based delta-sigma modulator ADCs have been used in such measurement circuits, but input buffer circuits are still typically required, since the input sampling capacitor must typically be made large enough to reduce the magnitude of thermal noise introduced in the input of the first amplifier/integrator stage. Furthermore, in programmable gain applications, the input sampling capacitor is typically adjusted, since adjusting the feedback capacitor of the integrator would impose variable performance requirements on the amplifier that is used in the integrator.

Raising the input capacitance of the input sampling capacitor to the level required to maintain low thermal noise injection lowers the impedance of the input circuit, and thus the above-mentioned buffers are typically required in such sampling circuits. The buffer must be designed to handle the relatively large differences that are typical between the common-mode voltage of the input source and the common-mode reference voltage of the input stage. In some implementations, a common-mode voltage reference is supplied to cancel the common-mode voltage of the measurement source thereby simplifying the requirements for the buffer circuit, but such implementations typically require an external integrated circuit terminal, buffering for the common-mode voltage source. Furthermore, the buffer circuits typically require considerable additional operating power.

Therefore, it would be desirable to provide a low-power high-impedance discrete-time input circuit for an ADC that does not require buffering or external common-mode reference.

SUMMARY OF THE INVENTION

The above stated objective of providing a low-power high-impedance discrete-time input circuit for an ADC that does not require buffering or an external common-mode voltage reference is accomplished in a circuit and method. The method is a method of operation of the circuit.

The circuit is a delta-sigma ADC having at least one input terminal for receiving a measurement input voltage. A switching circuit charges a reference feedback capacitor(s) to the input voltage with respect to a common-mode voltage source substantially matching the common-mode voltage of the input during a first clock phase. The reference feedback capacitor(s) has an initial charge equal to a quantizer-dependent reference feedback voltage, so that the only charge pulled from the input terminal corresponds to quantization error and noise. In a second clock phase, the switching circuit couples the reference feedback capacitor(s) between the reference voltage and the summing node of an integrator that provides the first stage of the delta-sigma ADC loop filter, thereby applying the charge on the reference feedback capacitors at the common-mode voltage of the reference feedback voltage source, maintaining the summing node at the common-mode voltage of the reference feedback voltage source and leaving a charge on the reference feedback capacitor(s) to cancel the input voltage on a next sampling phase. Since the reference feedback capacitor(s) is referenced to the input common mode voltage during the sampling phase and has no common mode charge during the second clock phase, the circuit provides a high common-mode input impedance.

The second clock phase can be split into "coarse" and "fine" phase portions, wherein in a first portion of the second clock phase, the reference feedback capacitor(s) are coupled to a buffered version of the reference or another voltage source substantially matching the reference voltage, so that most of the signal-dependent charge transfer occurs in the first portion of the second clock phase. In the subsequent "fine" phase portion, the reference feedback capacitor(s) are coupled directly to the feedback reference voltage source, so that any error in the voltage applied during the "coarse" phase is corrected.

An additional input gain-setting sampling capacitor may be coupled in parallel with the reference feedback capacitor(s) to sample the input signal in the first phase and then coupled between the common-mode voltage of the feedback reference voltage source and the summing node of the integrator in the second clock phase. The gain-setting sampling capacitor sets the gain of the integrator with respect to the input terminal without changing the gain with respect to the reference feedback voltage. The reference feedback capacitors may be a capacitor bank having multiple capacitors selectably coupled to one of a positive or negative reference voltage source, with the selected combination made in conformity with the quantizer output value. A duplicate switching circuit, gain-setting sampling capacitor and reference capacitor bank can be included to provide a differential ADC input circuit.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses discrete-time sampling integrator circuits and delta-sigma modulator-based analog-to-digital (ADC) converter circuits, in which a high input impedance, for both common-mode and signal voltages, is provided by using the reference capacitor (or capacitor bank) that provides the quantizer-dependent feedback reference voltage value as an input sampling capacitor. At sampling time, the reference capacitor has a charge corresponding to the reference feedback voltage from a previous clock phase. There is no common-mode voltage on the reference capacitor from the previous clock phase, as during that clock phase, the reference feedback voltage is applied with respect to the reference common-mode voltage. Since the quantizer-dependent feedback reference voltage value matches the input signal at low frequencies, except for quantization error and noise, a very small signal current is drawn from the input(s), resulting in a high signal input impedance. Furthermore, since the input is sampled with respect to the input common mode voltage in a first clock phase and has no common mode charge imposed from the previous clock phase, a high common-mode input impedance is maintained.

Additional input gain-setting sampling capacitors can be used to sample the input signal with respect to the input common mode voltage and are coupled in parallel with the reference capacitor during input sampling. During the second clock phase, the input gain-setting sampling capacitors are referenced to the common mode voltage of the reference and not the actual reference voltage, so that the gain of the ADC is increased with respect to the input voltage, but the gain with respect to the reference voltage stays fixed, providing for automatic scaling of the reference voltage. Therefore, a larger input capacitor can be used to provide higher gain, and a programmable gain integrator is more easily employed in the first stage of the loop filter, without requiring an input buffer to maintain a high input impedance.

Figure 1:
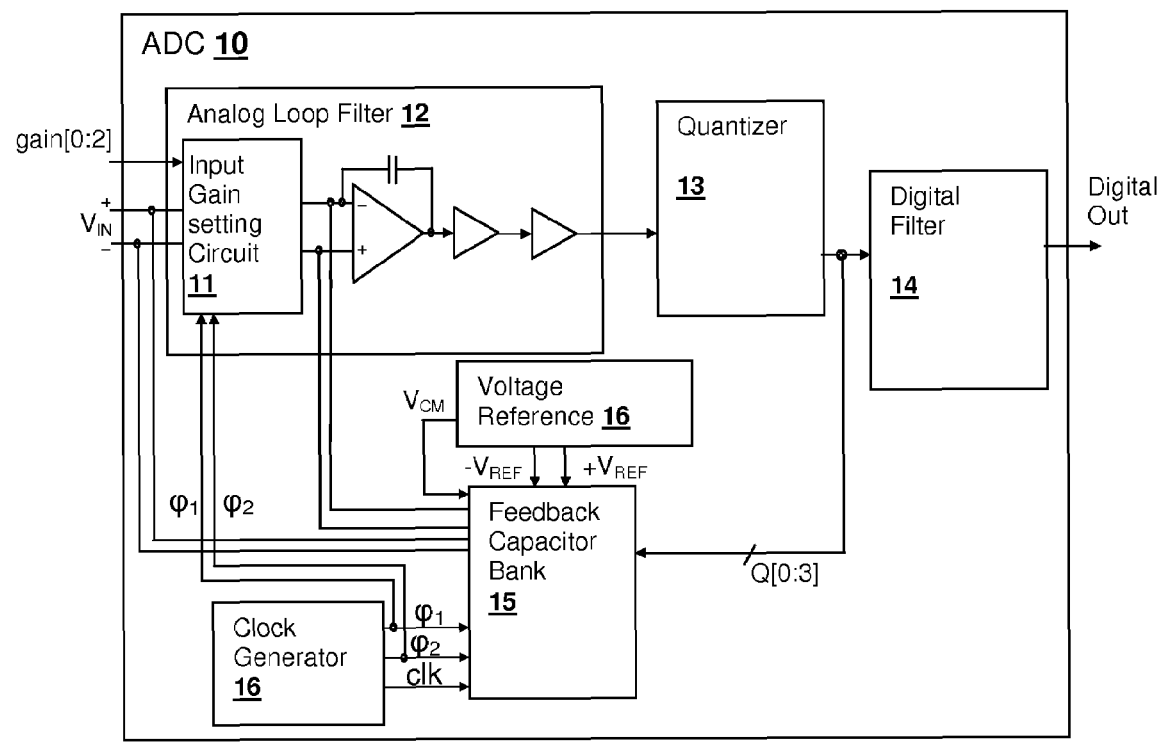
FIG. 1 is a block diagram depicting an ADC integrated circuit 10 in accordance with an embodiment of the present invention.

Referring now to FIG. 1, an ADC integrated circuit 10, in accordance with an embodiment of the present invention, is shown. An analog loop filter 12 receives a differential input voltage signal $V_{IN}$ and provides a noise-shaped output signal to the input of a quantizer 13 that provides digital sample values to a digital filter 14, which in turn provides an ADC conversion digital output value Digital Out. The output Q[0:3] of quantizer 13 is also provided to a feedback capacitor bank 15, in which capacitors are selected to couple them each to one of a positive and negative voltage reference (+$V_{REF}$, −$V_{REF}$) signal provided from a voltage reference circuit 16, with respect to the common voltage signal $V_{CM}$=(+$V_{REF}$−$V_{REF}$)/2) of voltage reference circuit 16, which is also provided as an output, and corresponds to the common-mode value of the reference feedback voltage selected by the quantizer output.

As mentioned above, feedback capacitor bank 15 is used to sample differential input voltage signal $V_{IN}$, and has an initial charge applied selected in conformity with quantizer outputs Q[0:3] from the previous clock phase. Since input voltage signal $V_{IN}$ is referenced to the common-mode voltage of the input signal(s) and the feedback charge is applied only a difference charge in the first clock phase, during sampling of the input terminals a current corresponding only to the quantization error and any noise is drawn. The summing node of the first integrator stage in analog loop filter 12 is maintained at the common mode voltage of the reference. An input gain-setting circuit 11, also samples the input voltage signal $V_{IN}$, except at a lowest gain setting, which uses only feedback capacitor bank 15 to sample differential input voltage signal $V_{IN}$. Outputs of input gain-setting circuit 11 are coupled to the first integrator stage in analog loop filter 12, as are output terminals provided from feedback capacitor bank 15. A clock generator 16 controls switching circuits within feedback capacitor bank 15 and input gain setting circuit 11 to control sampling of input signal $V_{IN}$ and application of quantizer-dependent feedback reference voltages to the first integrator stage of analog loop filter 12, as will be described in more detail below with reference to FIG. 2. Clock generator 16 provides two successive and non-overlapping clock phases: $\phi_1$ and $\phi_2$.

Figure 2:
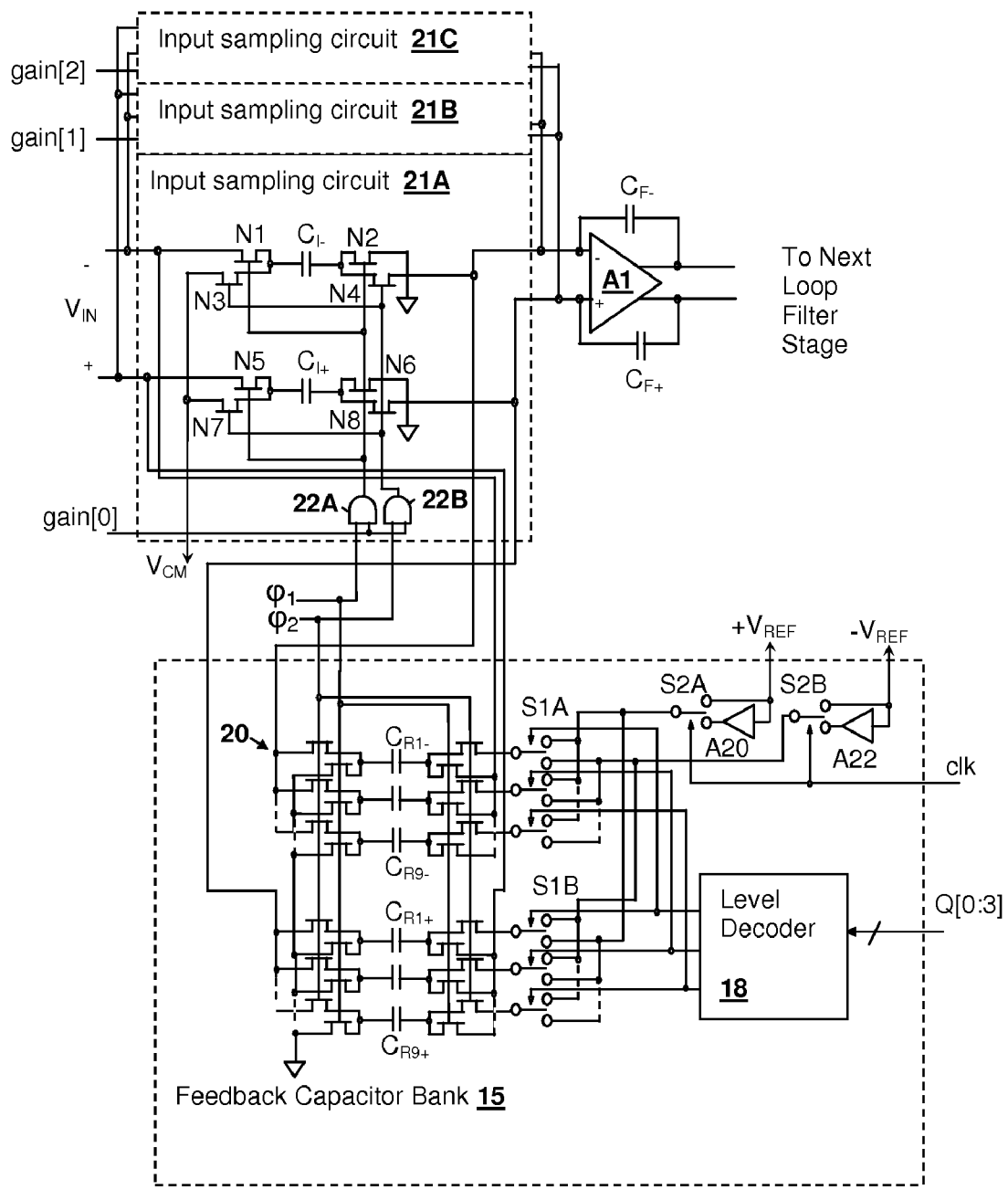
FIG. 2 is a schematic diagram depicting details of input sampler circuit 11 and feedback capacitor bank 15 of ADC integrated circuit 10.

Referring now to FIG. 2, details of input gain-setting circuit 11 and feedback capacitor bank 15 are shown. Input gain-setting circuit 11 is a differential circuit formed from multiple input sampler circuits 21A-21C, each having substantially identical design, except that in the exemplary embodiment, the capacitance sampling capacitors $C_I+,C_I-$ are weighted according to powers-of-two to provide programmable gain according to a binary value gain[0:2]. Other embodiments may weight the sampling capacitors $C_I+,C_I-$ according to other weighting schemes, or sampling capacitors $C_I+,C_I-$ may all be equally weighted. As illustrated, the exemplary input sampler circuit 21A has two sampling capacitors $C_I+,C_I-$ and a pair of switching circuits formed by transistors N1-N8, having gates controlled by clock phases $\phi_1$ and $\phi_2$, which are enabled according to the gain control input bit gain[0]. When clock phase $\phi_1$ is active, transistors N1,N2 and N5,N6 are activated, coupling sampling capacitors $C_I+$ and $C_I-$ between input terminals $V_{IN}$ and ground. When clock phase $\phi_2$ is active, transistors N3,N4 and N7,N8 are activated, coupling sampling capacitors $C_I+$ and $C_I-$ between reference common-mode voltage source $V_{CM}$ and the corresponding summing nodes of a programmable-gain integrator formed by amplifier A1 and feedback capacitors $C_F+,C_F-$.

Feedback capacitor bank 15 also includes a switching circuit 20 that is responsive to clock phases $\phi_1$ and $\phi_2$ and so that when clock phase $\phi_1$ is active, reference capacitors $C_{R1-}$-$C_{R9-}$ and $C_{R1+}$-$C_{R9+}$ are coupled in parallel with any of capacitors $C_I-$ in input sampler circuits 21A-21C that are enabled by the corresponding gain[n] signal to sample the voltage at input terminal $V_{IN}-$. During clock phase $\phi_2$, switching circuit 20 couples a first terminal of each of capacitors $C_{R1-}$-$C_{R9-}$ to the input of the integrator implemented by amplifier A1 and couples a second terminal of each of capacitors $C_{R1-}$-$C_{R9-}$ to a corresponding one of switch banks S1A or S1B. Switch banks S1A and S1B are controlled by the output of a level decoder 18 that receives quantizer output signals Q[0:3] and select which of reference voltages $V_{REF+}$ or $V_{REF-}$ to apply to each of capacitors $C_{R1-}$-$C_{R9-}$ and $C_{R1+}$-$C_{R9+}$ for the particular quantizer output level. The positions of reference voltages $V_{REF+}$ or $V_{REF-}$ are reversed for S1B with respect to switch bank S1A, so that a complementary set of capacitors is selected from capacitors $C_{R1+}$-$C_{R9+}$ for application of reference voltages $V_{REF+}$ or $V_{REF-}$. Therefore, a differential voltage is provided at the second terminal of capacitors $C_{R1-}$-$C_{R9-}$ to provide feedback to the integrator implemented by amplifier A1. The voltage on capacitors $C_{R1-}$-$C_{R9-}$ at the end of clock phase $\phi_2$ will act to cancel the input voltage during the next clock phase $\phi_1$ so that the current drawn from input terminals $V_{IN}$ will only be due to quantization error and noise. Therefore, the signal input impedance is maintained a high value.

The net charge corresponding to the feedback reference voltage remaining on capacitors $C_{R1-}$-$C_{R9-}$ at the end of clock phase $\phi_2$ will be shared among the total parallel combination of capacitors $C_{R1-}$-$C_{R9-}$ and any of capacitors $C_I-$ in input sampler circuits 21A-21C that are enabled by the corresponding gain[n] signal. The increased sampling capacitance due to enabled input sampler circuits 21A-21C will increase the charge injected into integrator feedback capacitor $C_{F1+}$ due to input voltage $V_{IN-}$, but not the charge due to the feedback reference voltage. The result is that as the input gain is increased, the feedback reference voltage is automatically scaled down to match the same input voltage range.

The charge injected into integrator feedback capacitor $C_{F-}$ is determined by the difference between the feedback reference voltages provided by the voltage on the parallel combination of capacitors $C_{R1-}$-$C_{R9-}$, as scaled by any charge sharing with capacitors $C_{I-}$ in input sampler circuits 21A-21C that are enabled, and input voltage $V_{IN-}$. Furthermore, since the parallel combination of capacitors $C_{R1-}$-$C_{R9-}$, and capacitors $C_{I-}$ in input sampler circuits 21A-21C that are enabled are always referenced to common-mode voltage of input terminals $V_{IN}$ in the first clock phase, which is the only interval of connection to input terminals $V_{IN}$, the circuit maintains a high common-mode input impedance, even though the summing nodes of amplifier A1 are maintained at the reference common mode voltage $V_{CM}$. The operation and switching of capacitors $C_{R1+}$-$C_{R9+}$, capacitors $C_{I+}$ and feedback capacitor $C_{F+}$ are the same as for capacitors $C_{R1-}$-$C_{R9-}$, capacitors $C_{I-}$ and feedback capacitor $C_{F-}$ as described above, but in opposing polarity. The "flying" parasitic capacitance (coupling capacitance) between the circuit nodes that connect terminals of capacitors $C_{I+}$ and $C_{I-}$ to transistors N2, N4, N6 and N8 should be minimized as well as the parasitic capacitance between the group of terminals of capacitors $C_{R1-}$-$C_{R9-}$ and the group of terminals of capacitors $C_{R1+}$-$C_{R9+}$ in circuit paths connected to switching circuit 20 that couple capacitors $C_{R1-}$-$C_{R9-}$ and capacitors $C_{R1+}$-$C_{R9+}$ to the summing nodes of amplifier A1. Additional steps may be required to maintain the summing nodes of amplifier A1 at the common-mode voltage of the reference, for example, bias resistors or additional switching circuits may be added to apply reference common-mode voltage $V_{CM}$ to the inputs of amplifier A1.

The relative capacitance of capacitors $C_{I+}$ and $C_{I-}$ are set in the exemplary embodiment to a value of G−1 times the capacitance of the total of capacitors $C_{R1-}$-$C_{R9-}$ (or $C_{R1+}$-$C_{R9+}$) where G is a scaling factor corresponding to the gain of the integrator formed around amplifier A1 with respect to input signal $V_{IN}$, relative to the feedback reference gain. Therefore, the total capacitance between each of the input terminals and the corresponding summing node of amplifier A1 is G times the capacitance of the reference bank capacitance.

Because the total number of capacitors $C_{R1+}$-$C_{R9+}$ and $C_{R1-}$-$C_{R9-}$ connected to each of reference voltage output $V_{REF+}$, $V_{REF-}$ of voltage reference 16 are equal, the effective DC voltage on the outputs of switches S1A and S1B is $V_{CM}$, no common-mode charge is pulled from voltage reference 16. To avoid introducing distortion at the reference voltage terminals, clock phase $\phi_2$ can be split into two phase portions: a "coarse" portion and a "fine" portion. Clock signal clk which is at twice the frequency of the period of clock phases $\phi_1$ and $\phi_2$ control switches S2A and S2B to select between actual reference voltage outputs $V_{REF+}$, $V_{REF-}$, and buffered versions of the reference voltage outputs provided by amplifiers A20 and A22. Because the signal-dependent charge on capacitors $C_{R1-}$-$C_{R9-}$ and capacitors $C_{R1+}$-$C_{R9+}$ will be removed shortly after the beginning of clock phase $\phi_2$ by action of amplifier A1 through feedback capacitors $C_{F-}$ and $C_{F+}$ the output of buffers A20 and A22 will response to the signal-dependent current.

The subsequent coupling of capacitors $C_{R1-}$-$C_{R9-}$ and capacitors $C_{R1+}$-$C_{R9+}$ directly to reference voltage outputs $V_{REF+}$, $V_{REF-}$ occurs after signal-dependent charge has been removed in the second portion of clock phase $\phi_2$, preventing distortion that would otherwise be generated by inducing signal-dependent components on reference voltage outputs $V_{REF+}$, $V_{REF-}$, that are dependent on the voltages at input terminals $V_{IN}$. Alternatively, another voltage source may be applied, as long as the voltage is close to that of the reference feedback voltage common-mode. For example, reference common-mode voltage source $V_{CM}$ could be applied until the signal-dependent charge is removed, but the voltage change from the first portion of clock phase $\phi_2$ to the second portion of clock phase $\phi_2$ as applied to reference capacitors $C_{R1-}$-$C_{R9-}$, and reference capacitors $C_{R1+}$-$C_{R9+}$, would extend over the full reference voltage range. Therefore, better performance can be had by the use of buffers A20 and A22, with consequent power and die area penalties.

Figure 3:
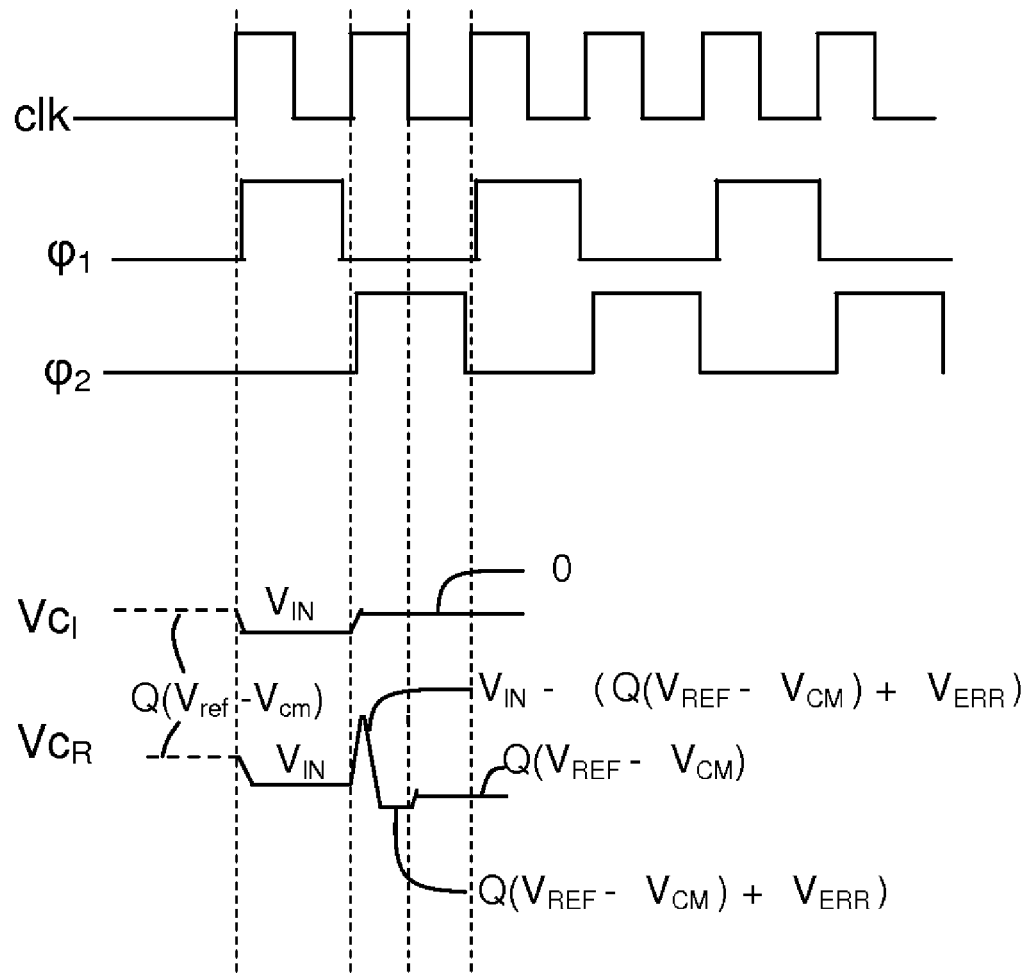
FIG. 3 is a signal time/voltage diagram depicting a relationship of signals within analog-to-digital converter integrated circuit 10 of FIG. 1.

Referring now to FIG. 3, operation of circuits within ADC integrated circuit 10 are illustrated in a signal time/voltage diagram. Clock phases $\phi_1$ and $\phi_2$ are shown as separate logical signals comprising non-overlapping pulses, along with voltage $V_{CI}$ representing an input gain-setting sampling capacitor voltage, e.g., the voltage on $C_{I-}$ of FIG. 1, and voltage $V_{CR}$ representing the effective voltage on the parallel combination of capacitors $C_{R1-}$-$C_{R9-}$ in the corresponding reference capacitor bank. As illustrated, during clock phase $\phi_1$ voltages $V_{CR}$ and $V_{CI}$, are set to $V_{IN-}$ by the sampling action. In clock phase $\phi_2$, voltage $V_{CR}$ is set to $V_{IN-}-Q(V_{REF}-V_{CM})$ where Q is a signed quantizer output value and normalized to 1. $V_{CI}$ is set to $V_{IN-}$, as the reference feedback is not applied to capacitor $C_{I-}$. At the end of clock phase $\phi_2$, $V_{CI}$ is zero, as capacitor $C_{I-}$ is completely discharged, and $V_{CR}$ is $Q(V_{REF}-V_{CM})$.

In the next clock phase $\phi_1$, capacitors $C_{I-}$ and $C_{R1-}$-$C_{R9-}$ are coupled in parallel, and therefore the charge remaining on the capacitors redistributes in combination with the applied input voltage, according to q=CV for the total capacitance, yielding $q=(V_{IN-}-Q(V_{REF}-V_{CM}))C_R+V_{IN}C_I$ where $C_R$ is the capacitance of the total of reference capacitors $C_{R1-}$-$C_{R9-}$ and $C_I$ is the capacitance of the total input gain-setting capacitance. Therefore, the total voltage across capacitors $C_{R1-}$-$C_{R9-}$ and capacitors $C_{I-}$ at the end of clock phase $\phi_1$ is $V_{IN}-Q(V_{REF}-V_{CM})C/G$, where G is the above-described gain scaling factor for $C_I$. Therefore the circuit has a gain of G with respect to the voltage of input signal $V_{IN-}$ and a gain of unity with respect to the reference feedback signal, assuming the integrator gain is G.

FIG. 3 also shows a division of clock phase $\phi_2$ into two portions, with an initial voltage of $V_{IN}-(Q(V_{REF}-V_{CM})+V_{ERR})$ present on capacitors $C_{R1-}$-$C_{R9-}$. Subsequent application of the actual reference feedback value corrects the voltage to $V_{IN}-Q(V_{REF}-V_{CM})$, which will cause a charge transfer equal to the product $C_RV_{ERR}$ at the beginning of the second portion of clock phase $\phi_2$, correcting any error due to the use of buffers A20, A22 or alternative voltage source.

Figure 4:
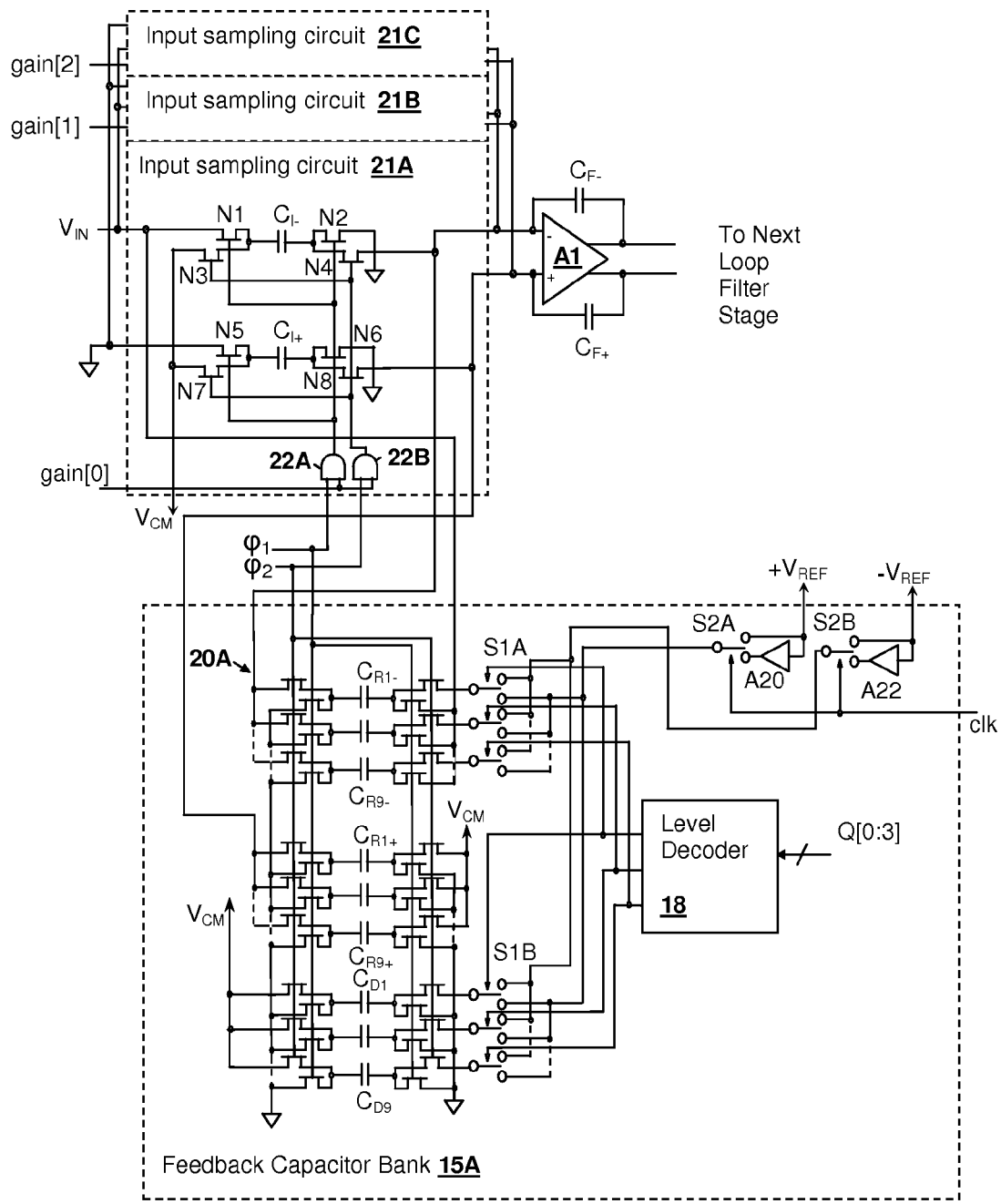
FIG. 4 is a schematic diagram depicting details of a single-ended input sampler circuit and feedback capacitor bank that may be alternatively or selectably employed in ADC integrated circuit 10.

Referring now to FIG. 4, details of another gain-setting circuit and feedback capacitor bank 15A are shown, as may be used to measure a single-ended signal provided to integrated circuit 10 of FIG. 1. The topology changes can be provided by additional switches, so that the circuit of FIG. 4 and the circuit of FIG. 2 can be selected in response to a logic signal. The circuit of FIG. 4 is similar to that of the circuit of FIG. 2, and therefore only differences between them will be described below. Input gain-setting circuit 11 is identical to that shown in FIG. 2, except that in the circuit of FIG. 4, only a single-ended input signal $V_{IN}$ is provided to transistor N1 and transistor N5 is connected to ground, which is the input common mode reference level. When clock phase $\phi_1$ is active, transistors N1,N2 and N5,N6 are activated, coupling sampling capacitor $C_{I^-}$ between input terminal $V_{IN}$ and ground and coupling both ends of sampling capacitor $C_{I^+}$ to ground. When clock phase $\phi_2$ is active, transistors N3,N4 and N7,N8 are activated, coupling sampling capacitors $C_{I^+}$ and $C_{I^-}$ between reference common-mode voltage source $V_{CM}$ and the corresponding summing nodes of a programmable-gain integrator formed by amplifier A1 and feedback capacitors $C_{F^+}, C_{F^-}$.

Feedback capacitor bank 15A includes a switching circuit 20A that is responsive to clock phases $\phi_1$ and $\phi_2$, as described above with respect to FIG. 2. However, feedback capacitor bank further includes a set of dummy capacitors $C_{D1}$-$C_{D9}$ that are coupled to switch bank S1B, rather than connecting switch bank S1B to reference capacitors $C_{R1+}$-$C_{R9+}$ as in FIG. 2. Since the input signal is single-ended, there is no signal to cancel on capacitor $C_{I^+}$ during clock phase $\phi_2$. Therefore, when clock phase $\phi_1$ is active, both ends of reference capacitors $C_{R1+}$-$C_{R9+}$ are coupled to ground (which is the input common mode voltage). During clock phase $\phi_2$, reference capacitors $C_{R1+}$-$C_{R9+}$ are coupled between the non-inverting summing node of amplifier A1 and the reference common mode voltage $V_{CM}$ in parallel with capacitor $C_{I^+}$, which was set to ground during clock phase $\phi_1$.

Since reference capacitors $C_{R1+}$-$C_{R9+}$ are not coupled to the reference source during clock phase $\phi_2$, dummy capacitors $C_{D1}$-$C_{D9}$ are provided to load the reference source, so that symmetrical loading of the reference source is maintained. The outputs of level decoder 18 control switch bank S1B, and clock signal clk control switches S2A and S2B as in the circuit of FIG. 2, but dummy capacitors $C_{D1}$-$C_{D9}$ are instead used to load the reference voltage sources symmetrically. Both ends of dummy capacitors $C_{D1}$-$C_{D9}$ are set to ground during clock phase $\phi_1$ so that when they are coupled to the reference by switch bank S1B and switch S2B during clock phase $\phi_2$, their initial common-mode potential is the same as the common-mode potential on reference capacitors $C_{R1-}$-$C_{R9-}$, which are coupled between $V_{CM}$ and the inverting summing node of amplifier A1. The action of dummy capacitors thus mimics the action of reference capacitors $C_{R1+}$-$C_{R9+}$ in FIG. 2 on the reference source, and provide opposite loading of the reference source with respect to reference capacitors $C_{R1-}$-$C_{R9-}$, in the circuits of both FIG. 2 and FIG. 4.

While the invention has been particularly shown and described with reference to the preferred embodiments thereof, it will be understood by those skilled in the art that the foregoing and other changes in form and details may be made therein without departing from the spirit and scope of the invention.

What is claimed:

1. A discrete-time sampling circuit, comprising:
   an input terminal for receiving an input voltage;
   an amplifier having a feedback capacitor connected from an output of the amplifier to an input of the amplifier to form an integrator;
   a gain-setting capacitor for changing a gain at the output of the integrator with respect to the input signal;
   a reference feedback capacitor; and
   a switching circuit for coupling the reference feedback capacitor and the input gain-setting capacitor in parallel and between the input terminal and a reference voltage substantially equal to a common-mode voltage of the input terminal in a first clock phase, coupling the reference feedback capacitor between a feedback reference voltage source and the input of the amplifier in a second clock phase, and coupling the input gain-setting capacitor between a common-mode reference voltage source and the input of the amplifier in the second clock phase whereby at repetitions of the first clock phase, a charge placed on the reference feedback capacitor during the second clock phase substantially reduces the charge transferred from the input terminal during the first clock phase.

2. The discrete-time sampling circuit of claim 1, further comprising a quantizer having an input coupled to an output of the amplifier, and wherein the charge placed on the reference capacitor during the second clock phase is set in conformity with the output of the quantizer, wherein the charge placed on the reference feedback capacitor substantially cancels the input voltage less a quantization error and input noise during repetitions of the first clock phase, whereby a high-impedance is provided at the input terminal at low frequencies.

3. The discrete-time sampling circuit of claim 1, further comprising a plurality of other gain-setting capacitors, whereby the input gain-setting capacitor and the other gain-setting capacitors form a selectable capacitance bank for selectably varying the gain at the output of the integrator with respect to the input signal in response to one or more gain selection control signals.

4. The discrete-time sampling circuit of claim 1, wherein a ratio of a capacitance of the input gain-setting capacitor to a capacitance of the reference feedback capacitor is set to a value of a gain factor minus one, wherein the gain factor is a ratio of the gain of the discrete-time sampling circuit with respect to the input voltage to the gain of the discrete-time sampling circuit with respect to the feedback reference voltage source.

5. The discrete-time sampling circuit of claim 1, wherein in a first portion of the second clock phase, the switching circuit couples the reference feedback capacitor to an alternate feedback reference voltage source, and couples the reference feedback capacitor to the feedback reference voltage source during a second portion of the second clock phase, whereby signal-dependent distortion on the feedback reference voltage source is prevented.

6. The discrete-time sampling circuit of claim 5, further comprising a buffer for providing the alternate feedback reference voltage source, wherein the buffer has an input coupled to the output of the reference feedback voltage source.

7. The discrete-time sampling circuit of claim 1, wherein the reference capacitor is a reference capacitor bank comprising a plurality of reference capacitors, and wherein during the second clock phase, a first terminal of each of the plurality of reference capacitors is selectably coupled to either a positive voltage reference source or a negative voltage reference source and a second terminal of each of the plurality of reference capacitors is coupled to the input of the amplifier.

8. The discrete-time sampling circuit of claim 1, wherein the amplifier is a differential amplifier, wherein the input terminal is a first input terminal, the reference feedback capacitor is a first reference feedback capacitor, and further comprising:
   a complementary second input terminal for providing a differential input voltage with respect to the voltage present on the first input terminal;
   a second reference feedback capacitor having a capacitance equal to the capacitance of the first reference feedback capacitor, and wherein the switching circuit further couples the second reference feedback capacitor to the complementary second input terminal during the first clock phase and couples the second reference feedback capacitor between a complementary feedback reference voltage source and a complementary input of the amplifier in the second clock phase.

9. The discrete-time sampling circuit of claim 8, wherein the input gain-setting capacitor is a first input gain-setting capacitor, and further comprising a second input gain-setting capacitor for changing a gain at the output of the integrator with respect to the input signal, and wherein the switching circuit further couples the second input gain-setting sampling capacitor in parallel with the second reference feedback capacitor during the first clock phase, and couples the second input gain-setting sampling capacitor between the common-mode reference voltage source and the complementary input of the amplifier during the second clock phase.

10. The discrete-time sampling circuit of claim 8, wherein the first and second reference feedback capacitors are first and second reference capacitor banks, respectively, each comprising a plurality of reference capacitors, and wherein in the first clock phase, each of the plurality of reference capacitors are coupled in parallel with their corresponding input gain-setting capacitor, and wherein in the second clock phase, a first terminal of each of the plurality of reference capacitors is selectably coupled to either a positive voltage reference source or a negative voltage reference source and a second terminal of each of the plurality of reference capacitors is coupled to a corresponding input of the amplifier, and wherein in the second clock phase, the plurality of reference capacitors in the second reference capacitor bank are coupled to an opposite one of the positive voltage reference source or the negative voltage reference source with respect to a reference voltage source coupled to the corresponding reference capacitor in the first reference capacitor bank.

11. The discrete-time sampling circuit of claim 1, wherein the amplifier is a differential amplifier, wherein the input gain-setting capacitor is a first input gain-setting capacitor, wherein the reference feedback capacitor is a first reference feedback capacitor, and further comprising:
   a second reference feedback capacitor having a capacitance equal to the capacitance of the first reference feedback capacitor, and wherein the switching circuit further couples the second reference feedback capacitor to the complementary second input terminal during the first clock phase and couples the second reference feedback capacitor between a complementary feedback reference voltage source and the reference voltage substantially equal to a common-mode voltage of the input terminal in the second clock phase; and
   a second input gain-setting capacitor for changing a gain at the output of the integrator with respect to the input signal, and wherein the switching circuit further couples the second input gain-setting sampling capacitor in parallel with the second reference feedback capacitor during the first clock phase, and couples the second input gain-setting sampling capacitor between the common-mode reference voltage source and the complementary input of the amplifier during the second clock phase.

12. A method of sampling an input voltage, comprising:
   during a first clock phase, charging a reference feedback capacitor and an input gain-setting capacitor to the input voltage; and
   during a second clock phase, first coupling the reference capacitor between a feedback reference voltage and a summing node of an integrator;
   during the second clock phase, second coupling the input gain-setting capacitor between a common-mode voltage of the reference feedback voltage and a summing node of an integrator, wherein a charge placed on the reference feedback capacitor by the first coupling substantially reduces the charge transferred from the input terminal during repetitions of the first clock phase.

13. The method of claim 12, further comprising determining the feedback reference voltage in conformity with a quantized representation of the input voltage, and wherein the charge placed on the reference feedback capacitor by the second coupling substantially cancels the input voltage less a quantization error and input noise, whereby a high-impedance at low frequencies is provided at a terminal supplying the input voltage.

14. The method of claim 12, further comprising selecting the input gain-setting capacitor from among combinations of a plurality of selectable input gain-setting capacitors.

15. The method of claim 12, further comprising:
   providing the input gain-setting capacitor with a first capacitance value; and
   providing the reference capacitor with a second capacitance value equal to the first capacitance value divided by a value equal to a gain factor minus one, wherein the gain factor is a ratio of gain of the integrator with respect to the input voltage to the gain of the integrator with respect to the reference voltage.

16. The method of claim 12, further comprising:
   quantizing an analog signal derived from an output of the integrator to generate a digital representation of the analog signal; and
   selectably coupling each of a plurality of capacitors in a reference capacitor bank providing the reference feedback capacitor to either of a positive or negative reference voltage source in combination, wherein the selected combination is made in dependence on a result of the quantizing.

17. The method of claim 12, wherein the integrator has differential inputs and wherein the discharging and coupling are performed for complementary pairs of reference and input gain-setting capacitors.

18. The method of claim 12, wherein the second clock phase comprises first and second portions, and wherein in a first portion of the second clock phase, the first coupling couples the reference capacitor between an alternate feedback reference voltage and a summing node of an integrator, and in a second portion of the second clock phase, the first coupling couples the reference capacitor between the feedback reference voltage and a summing node of an integrator.

19. The method of claim 18, further comprising buffering the feedback reference voltage to provide the alternate feedback reference voltage.

20. An analog-to-digital converter integrated circuit, comprising:
   a loop filter, having an input terminal for receiving an input voltage;
   a quantizer having an input coupled to an output of the loop filter for providing a noise-shaped digital representation of the input voltage;
   a digital filter coupled to an output of the quantizer for filtering the noise-shaped digital representation of the input voltage to provide a digital output value;
   an input gain-setting capacitor; and
   a feedback reference voltage source having an input coupled to the output of the quantizer for providing a feedback signal to the loop filter having a reference voltage value dependent on the noise-shaped digital representation of the input signal, wherein the first stage of the loop filter comprises a discrete-time integrator including a switching circuit, wherein the feedback reference voltage source includes a reference capacitor, wherein the switching circuit couples the reference capacitor and the input gain-setting capacitor in parallel between the input terminal and a common-mode reference voltage substantially equal to the common-mode voltage of the input terminal in a first clock phase, couples the reference capacitor between the reference voltage source and the summing node of the integrator in a second clock phase, and couples the input gain-setting capacitor between a common-mode voltage of the reference voltage source and the summing node of the integrator in the second clock phase, wherein a charge remaining on the reference capacitor during subsequent repetitions of the first clock phase substantially reduces the charge transferred from the input terminal during the second clock phase.

21. The analog-to-digital converter integrated circuit of claim 20, further comprising at least one other input gain-setting capacitor selectably coupled in parallel with the input gain setting capacitor, whereby a gain of the integrator with respect to the input voltage is set in conformity with one or more gain selection control signals.

22. The analog-to-digital converter integrated circuit of claim 20, wherein the reference capacitor is a reference capacitor bank comprising a plurality of reference capacitors, and wherein in the second clock phase, a first terminal of each of the plurality of reference capacitors is selectably coupled to either a positive voltage reference source or a negative voltage reference source and a second terminal of each of the plurality of reference capacitors is coupled to the summing node of the integrator.

23. The analog-to-digital converter integrated circuit of claim 20, wherein a capacitance of the input gain-setting capacitor divided by a total capacitance of the plurality of reference capacitors is equal to an input gain value minus one, whereby a reference dependent charge provided to the integrator relative to a signal-dependent charge provided to the integrator is scaled downward by a factor equal to the input gain value.

24. The analog-to-digital converter integrated circuit of claim 20, wherein in a first portion of the second clock phase, the switching circuit couples the reference capacitor to an alternate feedback reference voltage source, and couples the reference feedback capacitor to the reference voltage source during a second portion of the second clock phase, whereby signal-dependent distortion on the reference voltage source is prevented.

25. The analog-to-digital converter integrated circuit of claim 24, further comprising a buffer for providing the alternate feedback reference voltage source, wherein the buffer has an input coupled to the output of the reference voltage source.

* * * * *